United States Patent
Jung et al.

(10) Patent No.: US 7,973,888 B2
(45) Date of Patent: Jul. 5, 2011

(54) LIQUID CRYSTAL DISPLAY DEVICE HAVING MINIMIZED OUTER REGION

(75) Inventors: Tae-Yong Jung, Gyeongsangbuk-Do (KR); Jong-Hyun Park, Busan (KR); Do-Heon Kim, Busan (KR); Dae-Sung Jung, Seoul (KR); Jung-Eun Son, Seoul (KR)

(73) Assignee: LG Display Co., Ltd., Seoul (KR)

( * ) Notice: Subject to any disclaimer, the term of this patent is extended or adjusted under 35 U.S.C. 154(b) by 233 days.

(21) Appl. No.: 12/318,528

(22) Filed: Dec. 30, 2008

(65) Prior Publication Data

US 2009/0322998 A1 Dec. 31, 2009

(30) Foreign Application Priority Data

Jun. 25, 2008 (KR) .................. 10-2008-0060427

(51) Int. Cl.
*G02F 1/1335* (2006.01)
*G02F 1/1345* (2006.01)
*G02F 1/13* (2006.01)

(52) U.S. Cl. .................. 349/110; 349/122; 349/151

(58) Field of Classification Search .................. 349/110, 349/111, 149, 151, 152, 153, 187, 190
See application file for complete search history.

(56) References Cited

U.S. PATENT DOCUMENTS

| | | | | |
|---|---|---|---|---|
| 5,307,188 A * | 4/1994 | Dingwall et al. | ............... | 349/81 |
| 6,806,938 B2 * | 10/2004 | Asakura et al. | ............... | 349/151 |
| 7,436,473 B2 * | 10/2008 | Nam et al. | ............... | 349/110 |
| 7,800,718 B2 * | 9/2010 | Nakagawa | ............... | 349/110 |
| 2006/0125994 A1 * | 6/2006 | Hoshino et al. | ............... | 349/149 |

* cited by examiner

*Primary Examiner* — Akm E Ullah
(74) *Attorney, Agent, or Firm* — Morgan, Lewis & Bockius LLP

(57) ABSTRACT

The LCD device comprises a display region defined by a plurality of gate and data lines, and having a plurality of thin film transistors (TFTs), for displaying an image; a frame region disposed outside the display region, and composed of a first region having a reflection layer for displaying a color having a set brightness by reflecting incident light in a reflective mode, and a second region having a driving circuit pattern and a driving circuit for shielding incident light; and an outer region formed outside the frame region and having the driving circuit.

8 Claims, 3 Drawing Sheets

LIQUID CRYSTAL DISPLAY DEVICE HAVING MINIMIZED OUTER REGION

The present disclosure relates to subject matter contained in priority Korean Application No. 10-2008-0060427, filed on Jun. 25, 2008, which is herein expressly incorporated by reference in its entirety.

BACKGROUND OF THE INVENTION

1. Field of the Invention

The present invention relates to a liquid crystal display (LCD) device, and particularly, to an LCD device capable of reducing a display area thereof by minimizing an outer region by forming a part of a gate driving pattern in a frame region of a display unit.

2. Background of the Invention

Recently, various portable electric devices, such as mobile phones, personal digital assistant (PDA), and note book computers have been developed, because of their small size, light weight, and power-efficient operations. Accordingly, flat panel display devices, such as liquid crystal displays (LCDs), plasma display panels (PDPs), field emission displays (FEDs), and vacuum fluorescent displays (VFDs), have been developed. Of these flat panel display devices, the LCDs are currently massively produced because of their simple driving scheme and superior image quality.

The LCD device serves to display an image by forming a liquid crystal (LC) layer by injecting LC between two substrates facing each other, and then by applying an electric field to the LC layer. According to the electric field, LC molecules are differently aligned, by which optical transmittance is controlled.

The LCD device comprises an LC panel having an LC layer between two substrates, and having an electrode for applying an electric field to the LC layer; a back light serving as an optical source, for supplying light to the LC panel and controlling an optical amount according to arrangement of LC modules; and a driving unit disposed at an outer side of the LC panel, for driving the LC panel by applying a signal to the electrode of the LC panel.

The driving unit is implemented as a printed circuit board (PCB). And, the printed circuit board is classified into a gate PCB connected to gate lines of the LC panel, and a data PCB connected to data lines of the LC panel. The gate PCB and the data PCB are mounted to a gate pad unit and a data pad unit, respectively, in the form of a tape carrier package (TCP). Here, the gate pad unit is disposed on a side surface of the LC panel, and connected to the gate lines. And, the data pad unit is disposed on an upper surface of the LC panel intersecting with the side surface where the gate pad unit is formed, and connected to the data lines.

However, when the gate PCB and the data PCB are mounted to the gate pad unit and the data pad unit, respectively, the entire volume and weight are increased. Recently, is being widely used a portable multimedia device serving as both an image device and a sound device. The multimedia device has a screen larger than that of the conventional portable device such as a portable phone. According to this recent trend, required is a method for reducing the entire size and weight of a multimedia device with increasing a size of a screen to display an image.

Under this situation, has been proposed an LCD device having a gate in panel (GIP) structure in which the gate PCB and the data PCB are integrated as one unit to be mounted to one surface of the LC panel.

FIG. 1 is a view of an LCD device 10 having a GIP structure in accordance with the conventional art. The LCD device 10 has not only the GIP structure, but also a frame function to enhance an image quality by representing set colors at a frame region on a screen.

Referring to FIG. 1, the conventional LCD device 10 comprises a display region 20 for substantially implementing an image; a frame region 30 disposed outside the display region 20, for generating a frame effect in the display region 20 by displaying a color having a set brightness; and an outer region 40 formed outside the frame region 30 and provided with a gate driving circuit and a data driving circuit, for applying a signal onto the display region 20.

The frame region 30 displays a color of a predetermined brightness, and serves to distinguish the display region 20 and the outer region 40 from each other. The frame region 30 enables an image displayed on the display region 20 to be recognized by a viewer more clearly, and enhances the entire image quality of the LCD device 10. However, the frame region 30 is not a region where an image is substantially implemented. The LCD device 10 of FIG. 1 includes the frame region 30 and the outer region 40 where an image is not substantially implemented. Accordingly, the conventional LCD device 10 has a limitation in minimizing an entire area which influences on the entire size of a portable electronic device.

SUMMARY OF THE INVENTION

Therefore, an object of the present invention is to provide an LCD device having a minimized display area by partially forming a driving circuit pattern and a driving circuit in a frame region which implements a frame effect.

To achieve these and other advantages and in accordance with the purpose of the present invention, as embodied and broadly described herein, there is provided an LCD device, comprising: a display region defined by a plurality of gate and data lines, and having a plurality of thin film transistors (TFTs), for displaying an image; a frame region disposed outside the display region, and composed of a first region having a reflection layer for displaying a color having a set brightness by reflecting incident light in a reflective mode, and a second region having a driving circuit pattern and a driving circuit for shielding incident light; and an outer region formed outside the frame region and having the driving circuit.

A plurality of pixels having TFTs are formed in the display region. The frame region is composed of a first region having a reflection layer for displaying colors, and a second region having a driving circuit pattern for shielding incident light by a black matrix. A driving circuit is formed in the outer region.

The LCD device of the present invention has an effect to minimize an area of the outer region. More concretely, a part of the frame region for representing a color having a set brightness in a reflective mode is shielded by a black matrix, and by forming a driving circuit pattern or a driving circuit in the region shielded by the black matrix.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Description will now be given in detail of the present invention, with reference to the accompanying drawings.

Hereinafter, an LCD device having a minimized display area will be explained in more detail with reference to the attached drawings.

Figure 2:
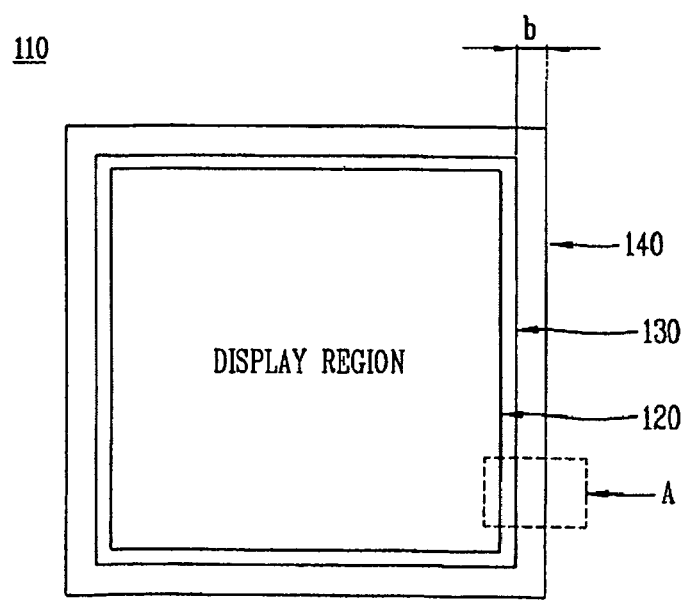
FIG. 2 is a planar view schematically showing a structure of an LCD device according to the present invention.

FIG. 2 is a planar view schematically showing a structure of an LCD device according to the present invention.

As shown in FIG. 2, the LCD device 110 according to the present invention comprises a display region 120 for substantially implementing an image; a frame region 130 disposed outside the display region 120, for generating a frame effect in the display region 120 by displaying a color having a set brightness on an edge of a screen; and an outer region 140 formed outside the frame region 130 and provided with a gate driving circuit and a data driving circuit, for applying a signal onto the display region 20.

Although not shown, the display region 120 is provided with a plurality of pixels defined by a plurality of gate lines and data lines crossing to each other. The pixels are provided with TFTs, and pixel electrodes for receiving signals from the driving circuit formed in the outer region 140 through the TFTs. Once a signal is applied to the pixel electrodes from the driving circuit, an electric field is applied to an LC layer in the display region 120. According to the electric field, LC molecules of the LC layer are differently aligned, by which transmittance of light passing through the LC layer is controlled. This enables an image to be displayed on the display region 120.

A plurality of pixel regions are also formed in the frame region 130. A signal is also applied to a pixel electrode of the frame region 130, thereby forming an electric field at the LC layer. According to the electric field, LC molecules are arranged. The frame region 130 displays a color of a predetermined brightness, and serves to distinguish the display region 120 and the outer region 140 from each other. The frame region 130 enables an image displayed on the display region 120 to be recognized by a viewer more clearly, and enhances the entire image quality of the LCD device 110.

On the outer region 140, formed are not only a gate driving circuit and a data driving circuit, but also a gate pattern and a data pattern for applying signals to the TFTs and the pixel electrodes by connecting the gate driving circuit and the data driving circuit to the TFTs and the pixel electrodes in the display region 120 and the frame region 130.

Figure 1:
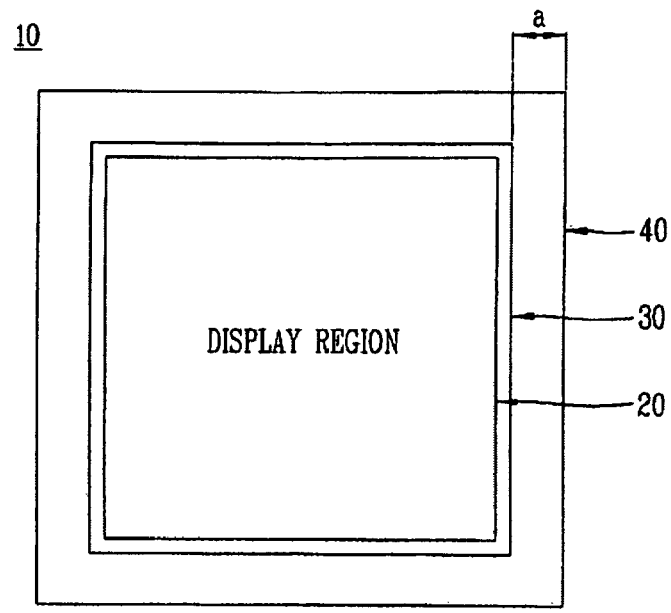
FIG. 1 is a planar view schematically showing a structure of an LCD device having a GIP structure in accordance with the conventional art.

Hereinafter, with reference to FIG. 3, will be explained reasons why a width (b) of the LCD device 110 of the present invention is smaller than a width (a) of the conventional LCD device 10 shown in FIG. 1.

Figure 3:
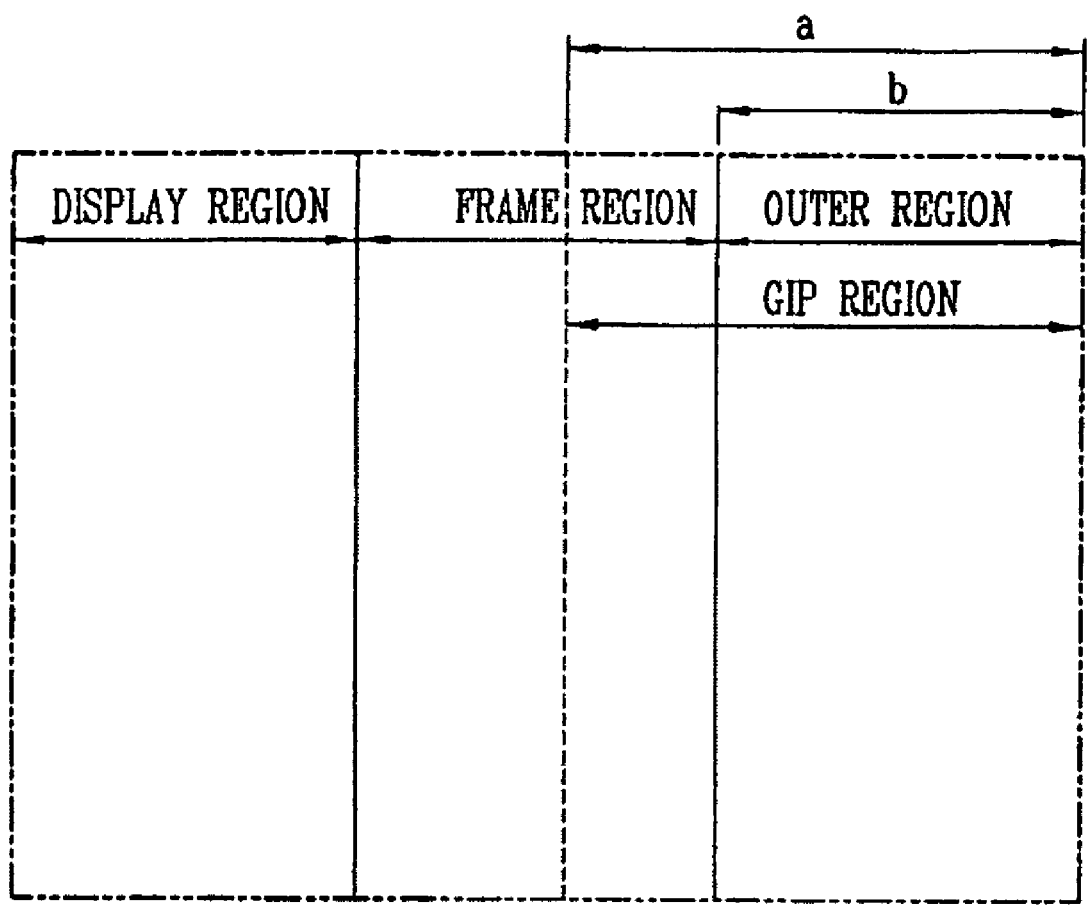
FIG. 3 is a partially enlarged view of a region, 'A' in FIG. 2.

FIG. 3 is a partially enlarged view of a region, 'A' in FIG. 2.

Referring to FIG. 3, the outer region disposed outside the frame region is not identical to a gate in panel (GIP) region where the driving circuit is substantially formed. That is, in the present invention, the GIP region partially overlaps the frame region, which means that the driving circuit is formed at not only the outer region but also the frame region. In the conventional LCD device, since an outer region is identical to a GIP region, a width of the outer region is the same as a width of the GIP region. On the contrary, in the present invention, the width (b) of the outer region is obtained by subtracting, from the width (a) of the GIP region, a width of the frame region (i.e., an overlapped width between the frame region and the GIP region)

In the present invention, the driving circuit is partially formed in the frame region not in the outer region, which reduces an area of the outer region more than in the conventional LCD device. The structure of the LCD device will be explained in more detail with reference to FIG. 4.

Figure 4:
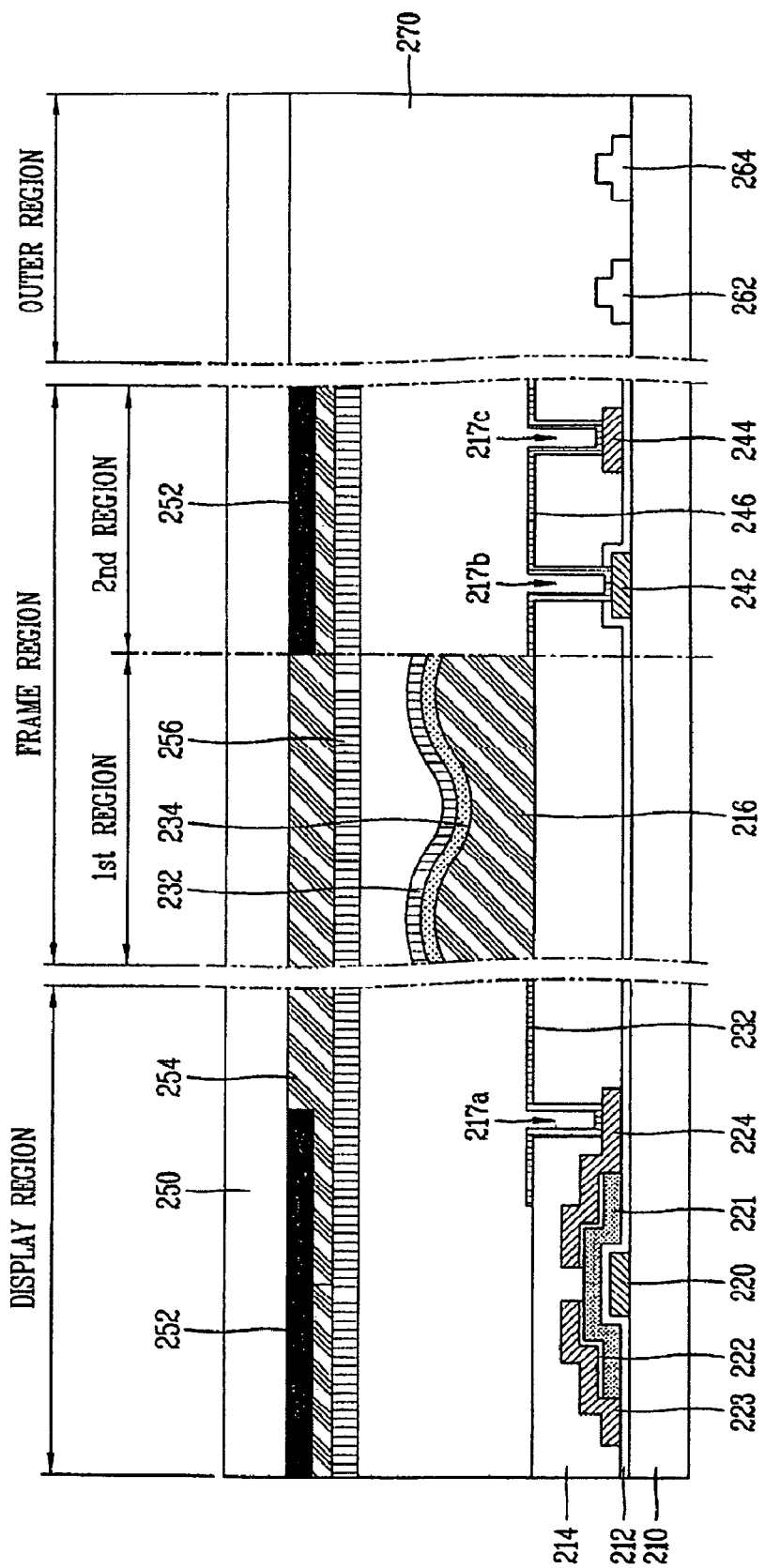
FIG. 4 is a sectional view of the LCD device according to the present invention.

FIG. 4 is a sectional view of the LCD device according to the present invention.

As shown in FIG. 4, the LCD device according to the present invention comprises a first substrate 210 and a second substrate 250 each formed of transparent glass, etc., and an LC layer 270 formed between the first substrate 210 and the second substrate 250. The LCD device is composed of a display region, a frame region, and an outer region. And, the frame region is classified into a first region and a second region.

The display region is a region where an image is substantially displayed, and is in a transmissive mode to display an image by controlling transmittance of light by transmitting the light to the LC layer 260. The frame region is not a region where an image is substantially displayed, but serves to implement set colors to an edge of a screen. The frame region is in a reflective mode to display an image by reflecting light incident from outside. And, the outer region is provided with the driving circuit, and is not displayed on the screen.

The reasons why the frame region is in a reflective mode are as follows.

The frame region does not serve to display various types of moving images, but serve to display a color having a preset brightness on the edge of the screen. This enhances image quality on the display region. Generally, the frame region displays a color having brightness lower than that of a color displayed on the display region. Accordingly, even if the frame region is set to be in a reflective mode not in a transmissive mode requiring high power consumption, a desired brightness can be obtained.

A gate electrode 220 is formed on the display region of the first substrate 210, and a gate pattern 242 is formed in the second region of the frame region. The gate pattern 242 serves to supply a signal to the electrode in the display region by connecting the electrode in the display region to the gate driving circuit of the frame region. The gate pattern 242 is formed in the outer region in the conventional art, whereas the gate pattern 242 is formed in the frame region in the present invention.

The gate electrode 220 and the gate pattern 242 may be formed through different processes. However, it is preferable to simultaneously form the gate electrode 220 and the gate pattern 242 through the same process for simplified processes and cost reduction. Although not shown, when the gate electrode 220 and the gate pattern 242 are formed, gate lines are formed.

The gate electrode 220 and the gate pattern 242 are formed by depositing metallic material such as Al, Mo, Cr, Cu, Al alloy, Mo alloy, Cr alloy, and Cu alloy over the first substrate 210, to form a single layer or a multi-layer by a sputtering method, and then by etching the single layer or multi-layer by a photolithography process using photoresist.

On the first substrate 210 where the gate electrode 220 and the gate pattern 242 are formed, formed is a gate insulation layer 212 made of an inorganic material such as SiOx or SiNx. A semiconductor layer 221 is formed on the gate insulation layer 212 in the display region, and an ohmic contact layer 222, a source electrode 223 and a drain electrode 224 are formed thereon. Accordingly, thin film transistors (TFTs) are formed in the display region. Here, the TFT formed of the gate electrode, the semiconductor layer, the source electrode and the drain electrode is also formed in the frame region, which was not shown in drawings for convenience.

The TFT formed in the frame region has the same structure and processes as those of the TFT formed in the display region. Accordingly, explanations for the TFT formed in the frame region will be omitted, and replaced by the TFT formed in the display region.

The semiconductor layer 221 is formed by depositing amorphous semiconductor on the gate insulation layer 212 by a physical enhanced chemical vapor deposition (PECVD) method. Then, impurities are injected into the semiconductor layer 221 to form the ohmic contact layer 222.

The source electrode 223 and the drain electrode 224 are formed by depositing metallic material such as Al, Mo, Cr, Cu, Al alloy, Mo alloy, Cr alloy, and Cu alloy over the first substrate 210, to form a single layer or a multi-layer by a sputtering method, and then by etching the single layer or multi-layer by a photolithography process. Although not shown, when the source electrode 223 and the drain electrode 224 are formed, data lines and a data pattern 244 are simultaneously formed. Here, the data pattern 244 is formed in the second region of the frame region. The data pattern 244 serves to transmit a signal of the data driving circuit formed in the outer region, to the electrodes in the display region.

A first passivation layer 214 is formed on the first substrate 210 where the source electrode 223 and the drain electrode 224 are formed in the display region and the frame region. The first passivation layer 214 is formed by depositing inorganic material such as SiNx or SiOx over the first substrate 210 by a PECVD method, or by depositing organic material such as benzo cyclo butene (BCB) or photo acryl over the first substrate 210.

A second passivation layer 216 formed of photo acryl is formed on the first passivation layer 214 in the first region of the frame region. And, a reflection layer 234 is formed on the second passivation layer 216. The second passivation layer 216 may be formed to be flat. However, preferably, the second passivation layer 216 is formed to have an embossed surface such that light incident from outside is reflected from the reflection layer 234 in various directions. The reflection layer 234 is formed by depositing a metallic layer having excellent reflectivity such as Al or AlNd on the second passivation layer 210 by a sputtering method, and then by etching the metallic layer by a photolithography process. The second passivation layer 216 is not formed in the second region of the frame region. More concretely, the second passivation layer 216 is formed in the entire part of the frame region, and then the second passivation layer 216 in the second region is etched, thereby exposing the first passivation layer 214 out.

A pixel electrode 232 is formed on the first passivation layer 214 in the display region, and on the reflection layer 234 in the first region of the frame region. And, a connection pattern 246 is formed on the first passivation layer 214 in the second region. The pixel electrode 232 and the connection pattern 246 are formed by depositing a transparent conductive material such as Indium Tin Oxide (ITO) or Indium Zinc Oxide (IZO) over the first substrate 210, and then by etching the transparent conductive material by a photolithography process. The pixel electrode 232 and the connection pattern 246 may be formed through different processes. However, it is preferable to form the pixel electrode 232 and the connection pattern 246 through the same process for simplified processes and cost reduction.

A first contact hole 217a is formed on the first passivation layer 214 in the display region. A second contact hole 217b is formed on the gate insulation layer 212 and the first passivation layer 214 in the second region of the frame region. And, a third contact hole 217c is formed on the first passivation layer in the frame region. The pixel electrode 232 in the display region is electrically connected to the drain electrode 224 of the TFT through the first contact hole 217a. And, the connection pattern 246 in the second region is electrically connected to the gate pattern 242 and the data pattern 244 through the second contact hole 217b and the third contact hole 217c. Actually, the connection pattern 246 connected to the gate pattern 242 and the data pattern 244 is implemented in two in number. However, one connection pattern 246 is shown in drawings for convenience.

On the second substrate 250, formed are a black matrix 252, a color filter layer 254, and a common electrode 256. The black matrix 252 is formed by depositing a single layer formed of Cr or CrOx or a multi-layer on the second substrate 250, and then by etching the single layer or multi-layer. The black matrix prevents light from passing through an image non-display region, thereby preventing deterioration of image quality.

The color filter layer 254 substantially represents colors by repeatedly arranging red, green, and blue (RGB) color filters. The common electrode 256 is disposed to face the pixel electrode 232 of the first substrate 210, and is supplied with a common voltage. As a pixel voltage is applied to the pixel electrode 232, an electric field is formed at the LC layer 270.

The black matrix 252 is formed in an image non-display region of the display region, i.e., a TFT forming region, a gate line forming region, and a data line forming region, thereby preventing light from leaking therethrough. The black matrix 252 is also formed in the second region of the frame region due to the following reasons.

As aforementioned, the frame region serves to display an image, even if a color having a set brightness is displayed. An image displayed on the frame region serves to more clearly distinguish the display region and the outer region from each other, which enhances image quality on the display region. Therefore, if an image or a color displayed on the frame region has a brightness higher than that of an image or a color displayed on the display region, a viewer has a difficulty in appreciating the substantial image on the display region. This causes the frame region to display an image having a relatively low brightness. To this end, the black matrix 252 is formed in the second region of the frame region. The black matrix 252 serves to shield a part of light incident to the second region from outside, and enables only light incident into the first region and reflected from the reflection layer 234, to pass through the LC layer 270. Accordingly, the black matrix 252 causes a color or an image having a relatively low brightness to be displayed.

In the present invention, the black matrix 252 is formed on the second substrate 250 in the second region of the frame region, and is not used as a reflective display region. This enables the second passivation layer 216 and the reflection layer 234 on the first substrate 210 to be removed. Accordingly, the gate pattern 242 and the data pattern 244 formed in the outer region in the conventional art can be formed on the first substrate 210 in the second region.

In the case that the second passivation layer 216 in the second region of the frame region is not removed, the connection pattern 246 can not be formed on the first passivation layer 214 in the second region. This makes it impossible to connect the connection pattern 246 to the gate pattern 242 and the data pattern 244 in the second region. Accordingly, the second passivation layer 216 is preferably removed so as to form the gate pattern 242 and the data pattern 244 in the second region.

The connection pattern 246 may be formed on the first passivation layer 214 in the second region, thereby being connected to the gate pattern 242 and the data pattern 244. However, in this case, the pixel electrode 232 formed in the first region of the frame region has to undergo processes differentiated from processes of the pixel electrode 232 in the display region and the connection pattern 246 in the second region. More concretely, the first passivation layer 214 is formed on the entire part of the first substrate 210, and a conductive material such as ITO or IZO is deposited thereon. Then, the conductive material is etched, thereby forming the pixel electrode 232 in the display region and the connection pattern 246 in the second region. Then, the second passivation layer 216 is formed, and the pixel electrode 232 is formed in the second region. This causes the number of processes to be more increased when compared to a configuration to connect the connection pattern 246 to the gate pattern 242 and the data pattern 244 by removing the second passivation layer 216 in the second region. Furthermore, since the first passivation layer 214 and the second passivation layer 216 can not be sequentially deposited on the first substrate 210, the entire processes become complicated and the processing time is increased.

In the present invention, the gate pattern 242 and the data pattern 244 formed in the outer region in the conventional art are formed in the frame region. This enables the outer region to have a minimized area, thereby reducing the entire size of the LCD device.

A gate driving circuit 262 and a data driving circuit 264 are formed in the outer region. Although not shown specifically, the gate driving circuit 262 and the data driving circuit 264 are respectively composed of a plurality of TFTs such as complementary metal-oxide semiconductor (CMOS), and a plurality of devices formed on the first substrate 210 and connected to the TFTs.

Here, the TFTs may be implemented as amorphous semiconductor devices or crystalline semiconductor devices. However, the TFTs of the gate driving circuit 262 are preferably implemented as amorphous semiconductor devices, whereas the TFTs of the data driving circuit 264 are preferably implemented as crystalline semiconductor devices.

The TFTs of the gate driving circuit 262 and the TFTs of the data driving circuit 264 may undergo processes equal to or different from processes of the TFTs formed in the display region. In the case that the TFTs of the data driving circuit 264 are implemented as crystalline semiconductor devices, may be added a process for depositing amorphous semiconductor devices over the first substrate 210 and then crystallizing the amorphous semiconductor device. More concretely, a single-crystalline semiconductor layer or a poly-crystalline semiconductor layer may be formed by making an amorphous semiconductor layer undergo a crystallizing process such as a sequential lateral solidification (SLS) process using laser.

Referring to FIG. 4, in the second region of the frame region, formed are the gate pattern 242 and the data pattern 244 for connecting the gate driving circuit 262 and the data driving circuit 264 of the outer region to the electrodes in the display region. However, in the second region, may be formed the gate pattern 242, the data pattern 244, the gate driving circuit 262 and the data driving circuit 264 such as CMOS TFTs or other devices.

Referring to FIG. 4, the gate driving circuit 262 and the data driving circuit 264 are formed in the outer region. And, the gate pattern 242 and the data pattern 244, or the gate driving circuit 262 and the data driving circuit 264 are partially formed in the second region of the frame region. However, it is also possible to form only the gate driving circuit 262 in the outer region, and to form only a part of the gate pattern 242 and the gate driving circuit 262 in the second region. Here, the data driving circuit 264 may be formed on an additional substrate adhered to the first substrate 210 such as a flexible printed circuit (FPC). It may be also possible to form only the data driving circuit 264 in the outer region, and to form only a part of the data pattern 244 and the data driving circuit 264 in the second region.

As aforementioned, in the present invention, the passivation layer in the second region of the frame region, i.e., the region shielded by the black matrix is removed. Then, the gate pattern or the data pattern, or the gate driving circuit or the data driving circuit formed in the outer region are arranged at the region where the passivation layer has been removed. Accordingly, the outer region has a width decreased by a width of the second region, which minimizes an entire area of the LCD device.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A liquid crystal display (LCD) device, comprising:
 a display region defined by a plurality of gate and data lines, and having a plurality of thin film transistors (TFTs), for displaying an image, the display region including:
 a first substrate and a second substrate;
 thin film transistors (TFTs) composed of gate electrodes formed on the first substrate, a gate insulation layer formed on the gate electrodes, a semiconductor layer formed on the gate insulation layer, and source and drain electrodes formed on the semiconductor layer;
 a first passivation layer formed on an entire part of the first substrate where the TFT is formed;
 a pixel electrode formed on the first passivation layer and electrically connected to the drain electrode of the TFT;
 a black matrix and a color filter layer formed on the second substrate; and an LC layer injected between the first and second substrates;

a frame region disposed outside the display region, and composed of a first region having a reflection layer for displaying a color having a set brightness by reflecting incident light in a reflective mode, and a second region having a driving circuit pattern and a driving circuit for shielding incident light, the frame region including:

a driving circuit pattern formed on the first substrate in a second region;

a first passivation layer formed on the first substrate in first and second regions;

a second passivation layer formed on the first passivation layer in the first region;

a reflection layer formed on the second passivation layer;

a pixel electrode formed on the reflection layer;

a connection pattern formed on the first passivation layer in the second region, and electrically connected to the driving circuit pattern;

a color filter formed on the second substrate, and a black matrix formed on the second substrate in a second region; and an LC layer injected between the first and second substrates; and an outer region formed outside the frame region and having the driving circuit.

2. The LCD device of claim 1, wherein the first passivation layer is formed of inorganic material or organic material.

3. The LCD device of claim 1, wherein the pixel electrode and the connection pattern are simultaneously formed.

4. The LCD device of claim 1, wherein the driving circuit pattern comprises at least one of a gate pattern and a data pattern.

5. The LCD device of claim 1, wherein the frame region further comprises a driving circuit formed in the second region.

6. The LCD device of claim 2, wherein the second passivation layer is formed of organic material.

7. The LCD device of claim 1, wherein the outer region comprises a driving circuit formed on the first substrate.

8. The LCD device of claim 7, wherein the driving circuit comprises at least one of a gate driving circuit and a data driving circuit.

* * * * *